(12) United States Patent
Eliyahu

(10) Patent No.: US 12,225,691 B2
(45) Date of Patent: Feb. 11, 2025

(54) COOLING APPARATUS FOR A SSD MEMORY IN A VIDEO GAME CONSOLE

(71) Applicant: Nexark, Inc., Davie, FL (US)

(72) Inventor: Menachem Eliyahu, Davie, FL (US)

(73) Assignee: Nexark, Inc., Davie, FL (US)

( * ) Notice: Subject to any disclaimer, the term of this patent is extended or adjusted under 35 U.S.C. 154(b) by 0 days.

(21) Appl. No.: 17/506,415

(22) Filed: Oct. 20, 2021

(65) Prior Publication Data

US 2023/0121013 A1  Apr. 20, 2023

(51) Int. Cl.
*H05K 7/20* (2006.01)
*H05K 5/02* (2006.01)
*H05K 5/04* (2006.01)

(52) U.S. Cl.
CPC ....... *H05K 7/20409* (2013.01); *H05K 5/0213* (2013.01); *H05K 5/04* (2013.01); *H05K 7/20136* (2013.01)

(58) Field of Classification Search
CPC ........ H05K 7/20409; H05K 5/02; H05K 5/04; H05K 7/20136
See application file for complete search history.

(56) References Cited

U.S. PATENT DOCUMENTS

| | | | | |
|---|---|---|---|---|
| 5,671,120 A * | 9/1997 | Kikinisi | ................... | G06F 1/20 361/699 |
| 11,147,189 B2 * | 10/2021 | Hyman | .............. | H05K 7/20409 |
| 11,272,640 B2 * | 3/2022 | Hur | ..................... | H05K 7/20463 |
| 2016/0081196 A1 * | 3/2016 | Babin, Sr. | ............... | B24B 37/30 451/364 |
| 2016/0262290 A1 * | 9/2016 | Chen | .................. | H05K 7/20545 |
| 2020/0154606 A1 * | 5/2020 | Hur | ..................... | H05K 7/20454 |
| 2021/0092871 A1 * | 3/2021 | Hur | ..................... | H05K 7/20145 |
| 2021/0112674 A1 * | 4/2021 | Ehlen | ................... | H05K 5/0026 |
| 2021/0227721 A1 * | 7/2021 | Hyman | ................ | H05K 5/0213 |
| 2021/0294386 A1 * | 9/2021 | Eliyahu | ................ | G11B 33/123 |
| 2022/0053656 A1 * | 2/2022 | Lee | ....................... | H05K 5/0221 |

OTHER PUBLICATIONS

Screen captures from YouTube video clip entitled "SABRENT Rocket Heatsink For PS5 Is Coming! Cool Your SSD Properly!", 6 pages, uploaded on Sep. 8, 2021 by user "Sabrent USA Official". Retrieved from Internet: https://www.youtube.com/watch?v=Ytp6fEq9eSw (Year: 2021).*

(Continued)

*Primary Examiner* — Abhishek M Rathod
(74) *Attorney, Agent, or Firm* — Leason Ellis LLP

(57) ABSTRACT

A heat sink for a solid-state drive (SSD) storage device for use as an extended memory in an expansion slot of a gaming console has a metal top plate of sufficient width and length to cover the exterior opening of the expansion slot. The top plate has fins on its upper surface that extend at a diagonal across the longitudinal extent of the top plate. The heat sink further includes a metal bulk body connected to the bottom of the top plate and having a sufficient width and length to nearly fill the interior of the expansion slot and a thickness so that when the heat sink is mounted on the SSD storage device, the top plate is positioned above the upper edge of the expansion slot. A thermal adhesive is provided on the bottom of the bulk body for fastening the heat sink to the top of the SSD storage device.

6 Claims, 6 Drawing Sheets

(56) References Cited

OTHER PUBLICATIONS

Screen Captures from Amazon.com listing entitled "Sabrent M.2 2280 SSD Rocket Heatsink (SB-HTSK)", 13 pages, Date First Available: Jun. 28, 2019, Retrieved from Internet: https://www.amazon.com/dp/B07TN2RX2K/ref=cm_sw_su_dp?th=1 (Year: 2019).*

Screen Captures from Amazon.com listing entitled "EZDIY-FAB M.2 SSD heatsink 2280 . . . ", 13 pages, Date First Available: Apr. 7, 2020, Retrieved from Internet: https://www.amazon.com/dp/B086W55ZNF/ref=cm_sw_su_dp?th=1 (Year: 2020).*

Screen Captures from Amazon.com listing entitled "icepc M.2 Heatsink PS5 PCI-E NVME 2280 . . . ", 12 pages, Date First Available: Sep. 4, 2020, Retrieved from Internet: https://www.amazon.com/dp/B08HGF4HKK/ref=cm_sw_su_dp?th=1 (Year: 2020).*

Screen Captures from Amazon.com listing entitled "SABRENT M.2 NVMe Heatsink for The PS5 Console (SB-PSHS)", 15 pages, Date First Available: Sep. 12, 2021, Retrieved from Internet: https://www.amazon.com/dp/B09HSQQWCL?th=1 (Year: 2021).*

Screen captures from YouTube video clip entitled "How to install PS5 SSD & Heatsink (Best Tutorial)", 3 pages, uploaded on Sep. 25, 2021 by user "YourSixStudios". Retrieved from Internet: https://www.youtube.com/watch?v=kta9n_xSCQE (Year: 2021).*

ElecGear PS5 NVMe SSD Heatsink, EL-P5C Heat Pipe + Solid Aluminum cooler for PlayStation 5 internal PCle M.2 NVMe 4.0 Gen4 Gaming Memory, thermal pads and Re-Designed SSD Mounting Post Kit. (Jun. 1, 2021). Amazon.com. Retrieved Mar. 13, 2024, from https://www.amazon.com/ElecGear-Heatsink-EL-P5C-Playst.*

Amazon.com: "ElecGear PS5 NVMe SSD Heatsink, EL-P5C Heat Pipe . . . " Jun. 1, 2021, https://web.archive.org/web/20211001051723/https://www.amazon.com/ElecGear-Heatsink-EL-P5C-Playstation-Re-Designed/dp/B096K4WKV9 (Year: 2021).*

Office Action of European Application No. 22201343.5 dated Apr. 26, 2024.

Extended European Search Reporting in corresponding European Application No. 22201343.5, dated Mar. 1, 2023.

* cited by examiner

COOLING APPARATUS FOR A SSD MEMORY IN A VIDEO GAME CONSOLE

FIELD OF THE INVENTION

The present invention relates to the cooling of SSD memory devices used as auxiliary memory in a digital device and, more particularly, to a heat sink for an auxiliary SSD memory in a video game console.

BACKGROUND OF THE INVENTION

A solid-state drive (SSD) is a storage device that uses flash-based memory. It has a large storage capacity and a fast read/write cycle. Such a device may be used as extended memory in an electronic console. For example, the Sony PLAYSTATION® 5 (PS5®) console allows for the addition of an M.2 SSD with a cooling structure as extended memory. The cooling structure is typically a heat sink which has the same length and width dimensions as the memory.

The extended memory is installed in an expansion slot inside the bottom cover of the PS5®. The expansion slot has its own cover secured over the slot with screws. In order to install the extended memory the expansion slot cover is removed and the SSD memory with its attached heat sink is inserted. It fills about ⅔rds of the length of the slot. Then the slot cover is replaced so it covers the SSD and heat sink combination. Finally the console cover is replaced.

The expansion slot of the PS5® has two air chambers/exhaust holes which extend to the area below the slot cover where the SSD is located. These holes are toward the interior of the PS5® where an internal cooling fan is located in the circuit board that holds the SSD slot. In operation the fan draws air from outside the PS5® along an edge where the expansion slot is located. The air passes over the slot cover through the fan in the circuit board and blows out the other side. The air drawn into the PS5® travels over the slot cover. Thus, the slot cover prevents air from being drawn over the top of the heat sink, so the cooling effect of the heat sink is minimal. Air is also drawn out of the two exhaust holes. Since the area below the slot cover is otherwise closed, a negative pressure is crated below the slot cover.

Heat sinks on typical SSDs used for the extended memory of the PS5® have cooling fins that run parallel to the long axis of the SSD. The minimal air drawn from the exhaust holes tends to be blocked by these longitudinal fins and further hampers cooling.

Because of the dense packing of the SSD, e.g., a terabyte in a space of a few inches, and the speed at which it operates, a relatively large amount of heat is generated. The cooling system of the PS5® has proven to be inadequate for maximum use of the extended memory. It would therefore be beneficial if an alternative cooling system could be provided that would remove much more heat.

SUMMARY OF THE INVENTION

The heat sink of the present invention, unlike the prior art, extends the full length and width of the memory slot and its full height. Thus it is a larger piece of metal than the prior art heat sinks and thus provides more cooling. Further, the heat sink, since it extends the entire length and width of the slot, is designed with a height so that the slot cover is not used. As a result the air produced by the fan is drawn over the top of the heat sink as well as through the channels from the area under the heat sink where the SSD memory is located. This provides another cooling effect.

The prior art heat sinks have fins that run parallel to the long dimension of the SSD, but no air is actually drawn over them. With the heat sink of the present invention its fins are positioned at an angle across the SSD, and are in the air flow path from the console intake vents to the fan, which facilitate the passage of air along the fins toward the fan. In effect they are angled generally toward the fan. This further improves the cooling efficiency of the heat sink.

BRIEF DESCRIPTION OF THE DRAWINGS

The foregoing and other objects and advantages of the present invention will become more apparent when considered in connection with the following detailed description and appended drawings in which like designations denote like elements in the various views, and wherein.

DETAILED DESCRIPTION OF THE INVENTION

Figure 1:
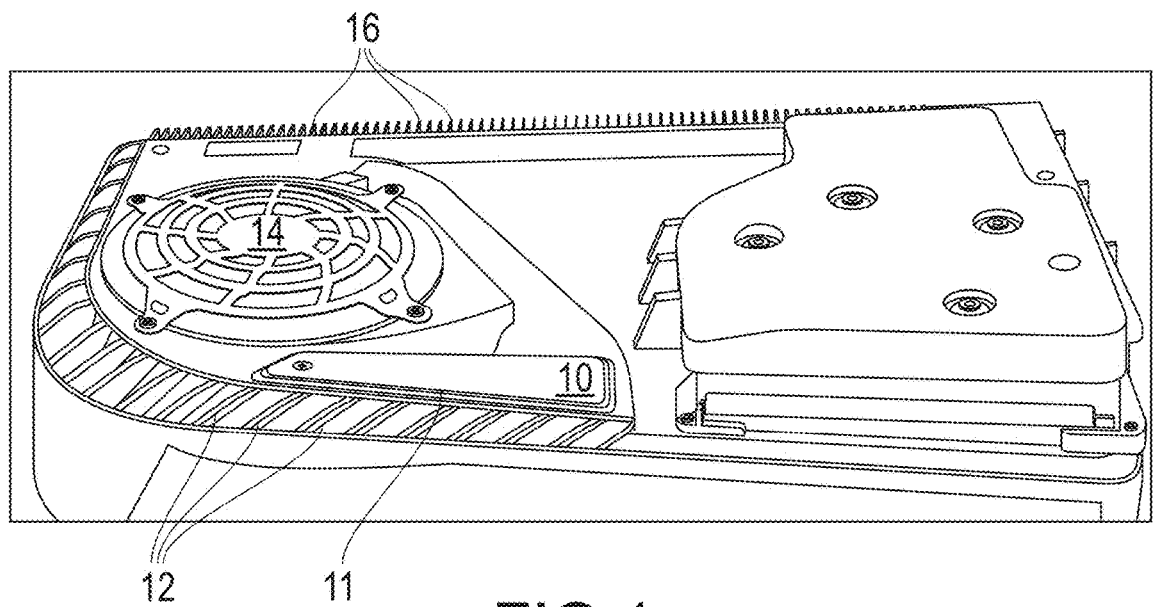
FIG. 1 is a perspective view of the bottom of a Sony PLAYSTATION® 5 console with the cover off showing the expansion slot.
Figure 2:
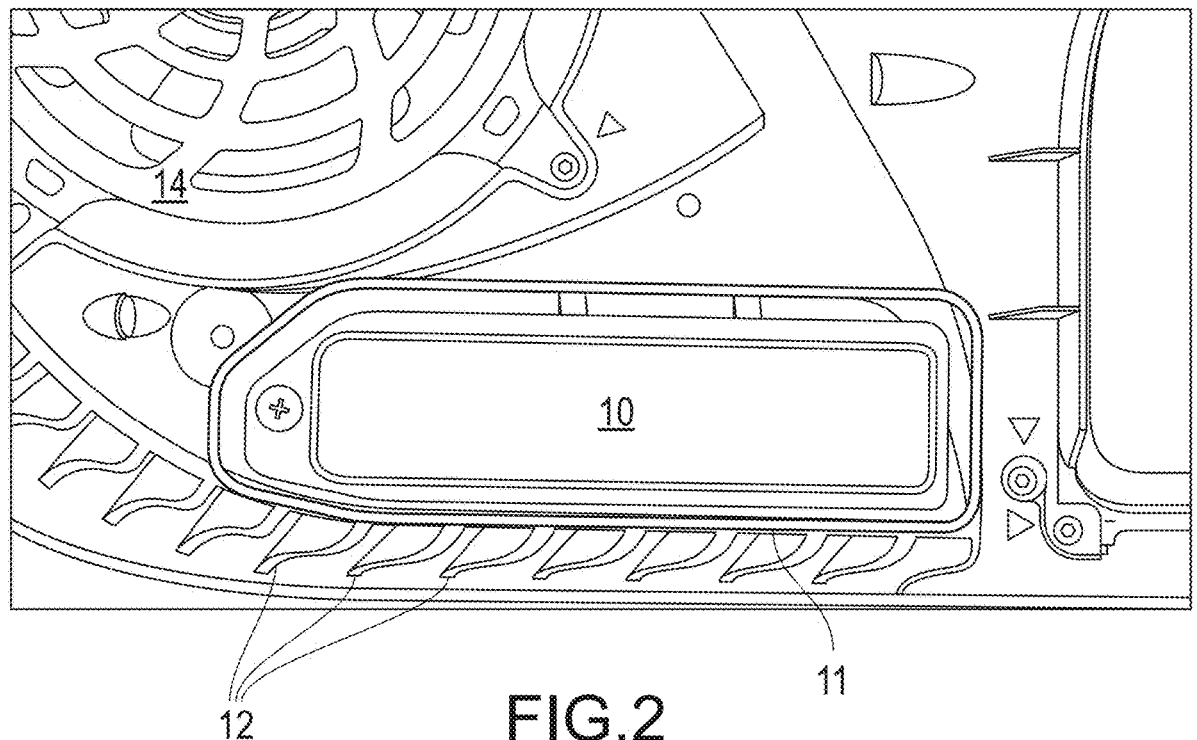
FIG. 2 is a top view of the expansion slot in the bottom of a PLAYSTATION® 5 console with the slot cover in place.

FIGS. 1 and 2 show the bottom of a Sony PLAYSTATION® S console with the console cover off showing the expansion slot 11 with the slot cover 10 in place. On the side of the console next to the slot 11 are intake air vents 12. Air is pulled into the bottom side of the console (top side in this view) by fan 14 located on circuit board. The air passes through the fan 12 and is discharged on the other side of the console through vents 16.

Figure 3:
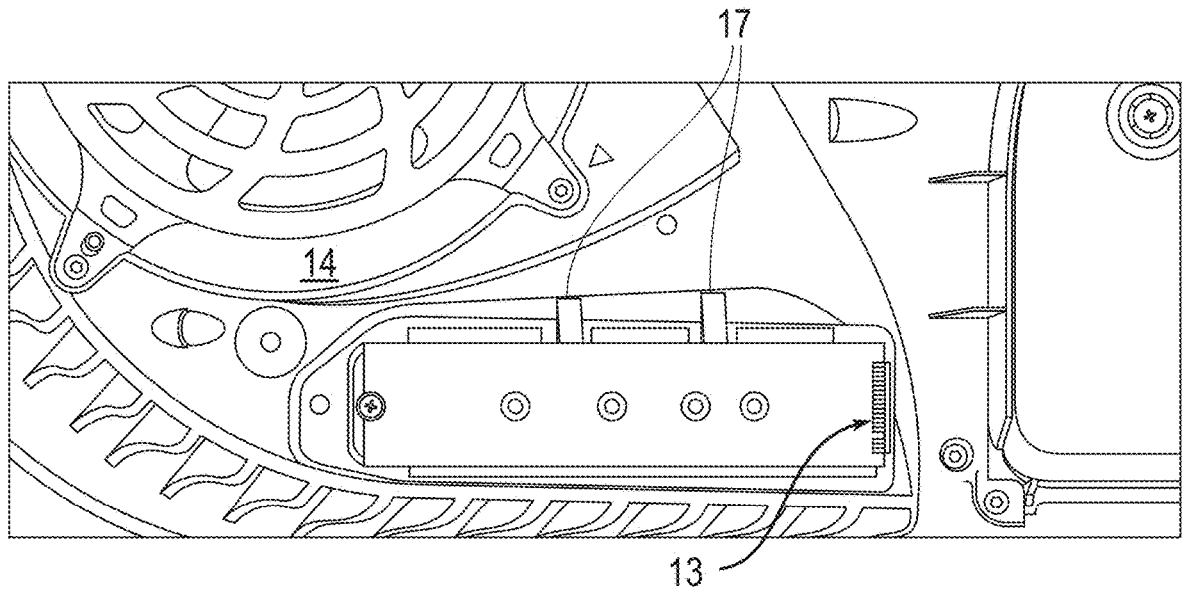
FIG. 3 is a top view of the expansion slot in the bottom of a Sony PLAYSTATION® 5 console with the slot cover off.
Figure 4:
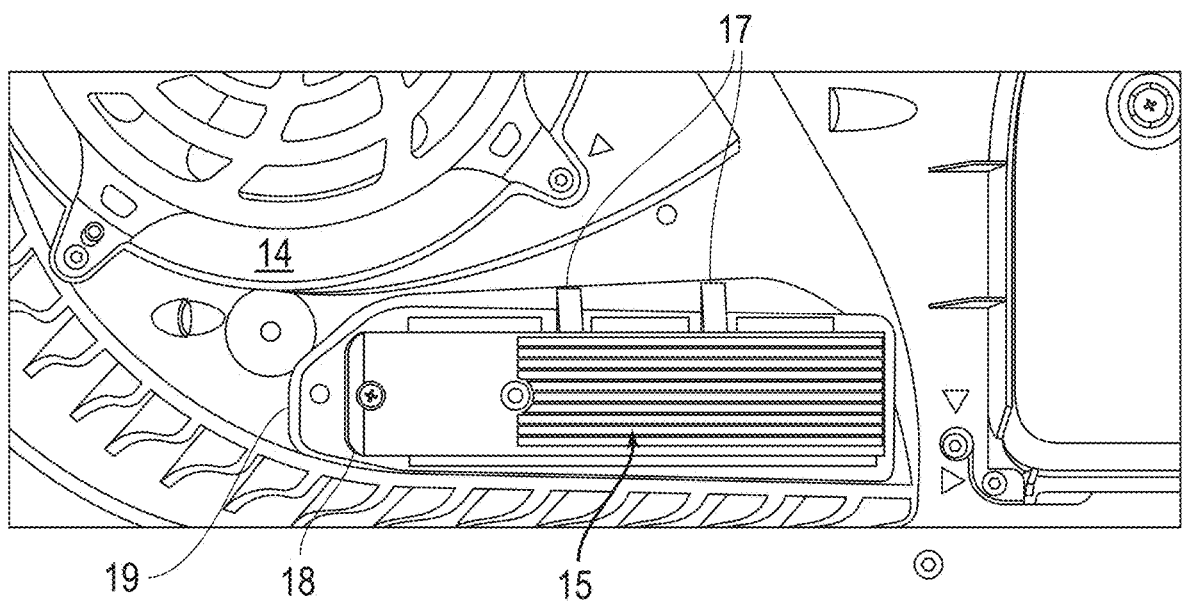
FIG. 4 is a top view of the expansion slot in the bottom of a Sony PLAYSTATION® 5 console with a prior art SSD and heat sink installed.

FIGS. 3 and 4 show the expansion slot with the cover removed. A socket 13 is at the right side of the slot in FIG. 3. FIG. 4 shows a prior art SSD memory with a heat sink 15 attached to its top. The SSD is inserted into socket 13 within the slot. Notice that the SSD memory and its heat sink to not take up the entire length of the slot. Further, the fins on the prior heat sink are parallel to the longitudinal extent of the heat sink, thus blocking air flow toward the fan. FIGS. 3 and 4 show chambers or holes 17 that penetrate the side wall of the slot 11 that is toward fan 14. The fins on heat sink 15 are also rather tall, extending above the top surface of the heat sink and causing additional blocking of air flow across the heat sink to the holes 17.

Figure 5:
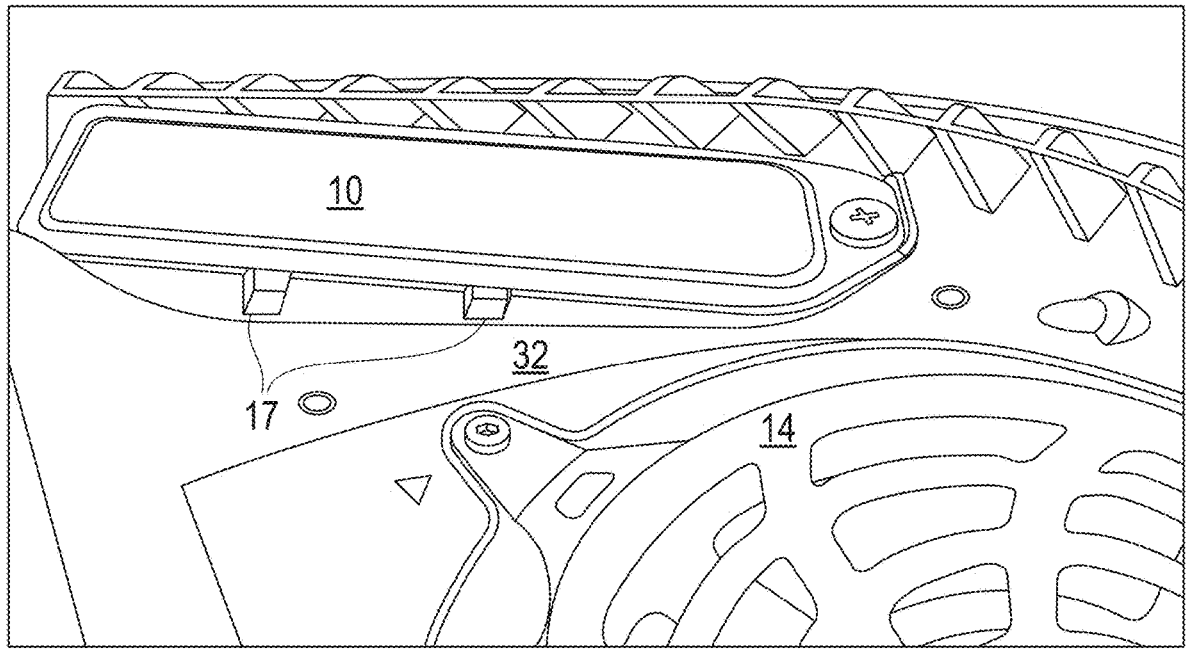
FIG. 5 is a perspective view of the expansion slot with the slot cover installed and showing exhaust chambers or holes in the side of the slot.

FIG. 5 shows the slot cover 10 installed over the slot 11 in an interior cover 32 of the console, which leaves the chambers or holes 17 open. As a result, when fan 14, which is attached to the same interior cover, is operating if sucks air out of these holes creating a negative pressure in the slot under the cover 10. Since the SSD is within the slot under the cover, there is very little cooling effect created by the heat sink 15 due to air flow and what there might be is blocked by the orientation and height of the fins on the heat sink 15.

Figure 8:
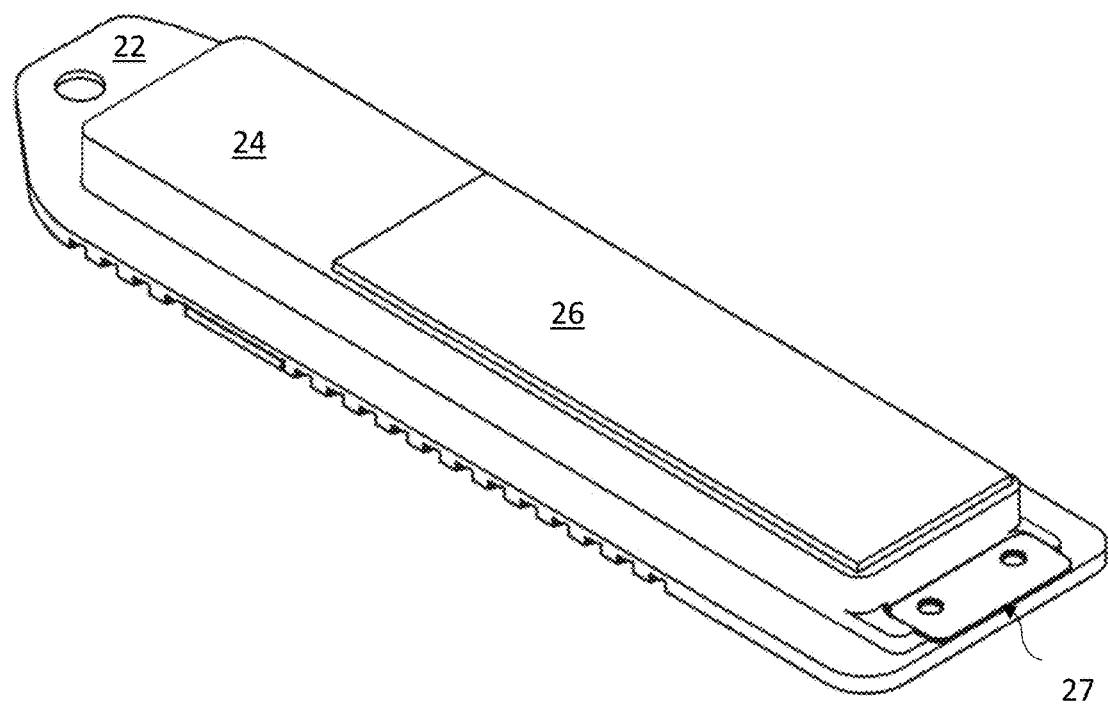
FIG. 8 is a bottom, rear, left side perspective view of the heat sink of the present invention.
Figure 9:
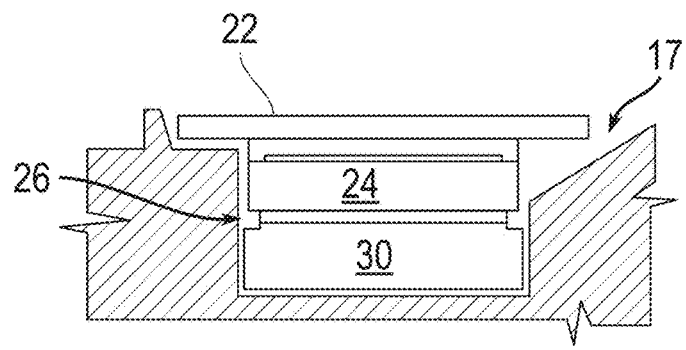
FIG. 9 is a cross-sectional view through an air chamber of the expansion slot with the heat sink of the present invention installed.

Further, the heat sink has a thermal adhesive 26 (FIG. 8) on its bottom which allows it to be easily attached to the top of the SSD memory 30 as it sits in the slot in the interior cover 32 as shown in FIG. 9. The thermal adhesive is preferably made of thermal conductive materials and cyanoacrylate, but could be made of other adhesives that allow for a firm connection as well as the ready transfer of heat from the SSD memory to the heat sink. FIG. 9 also shows how the chambers or holes 17 provide access to the area under top plate 22 to assist in cooling.

FIG. 5 shows the slot cover 10 installed over the slot 11, which leaves the chambers or holes 17 open. As a result, when fan 14 is operating if sucks air out of these holes creating a negative pressure in the slot under the cover 10. Since the SSD is within the slot under the cover, there is very litting cooling effect created by the heat sink 15 due to air flow and what there might be is blocked by the orientation and height of the fins on the heat sink 15.

Figure 6:
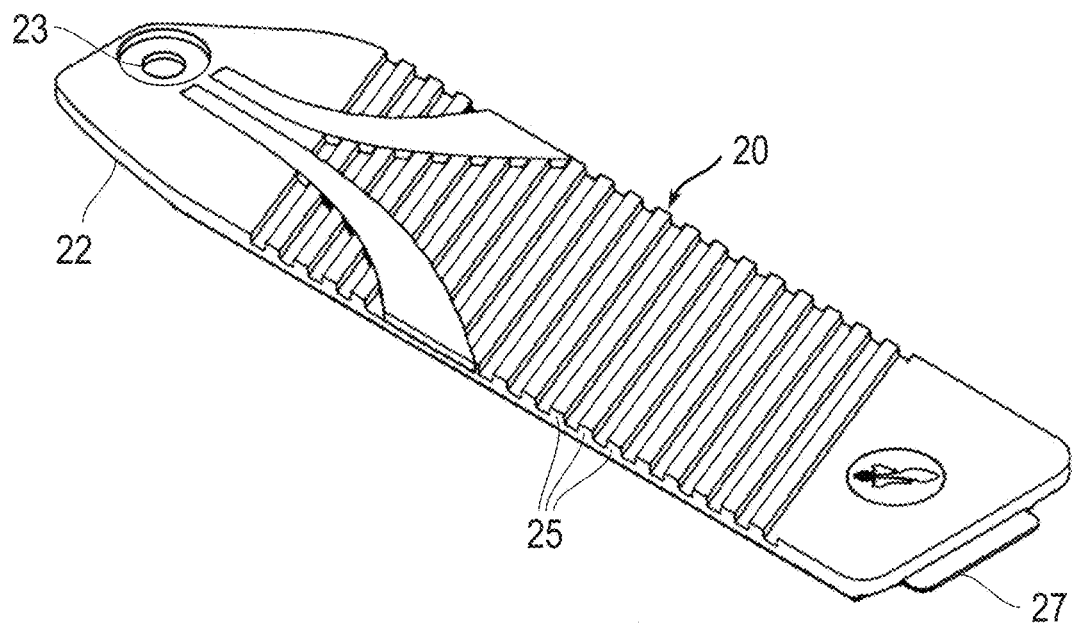
FIG. 6 is a top, rear, right side perspective view of a heat sink according to the present invention.
Figure 7:
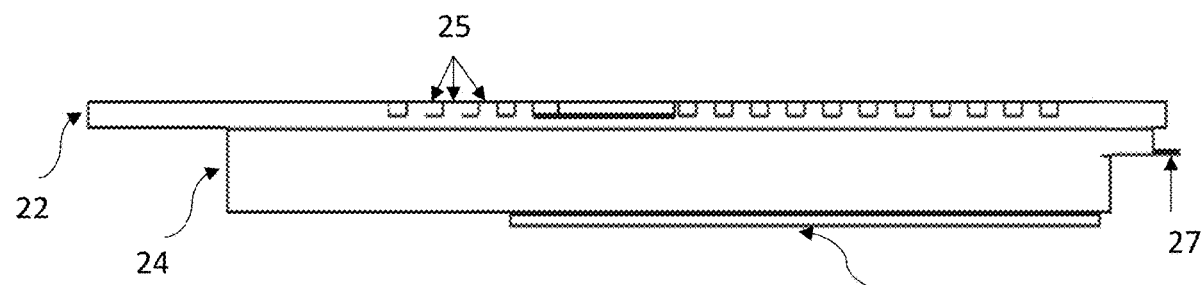
FIG. 7 is a side view of the heat sink of the present invention.
Figure 10:
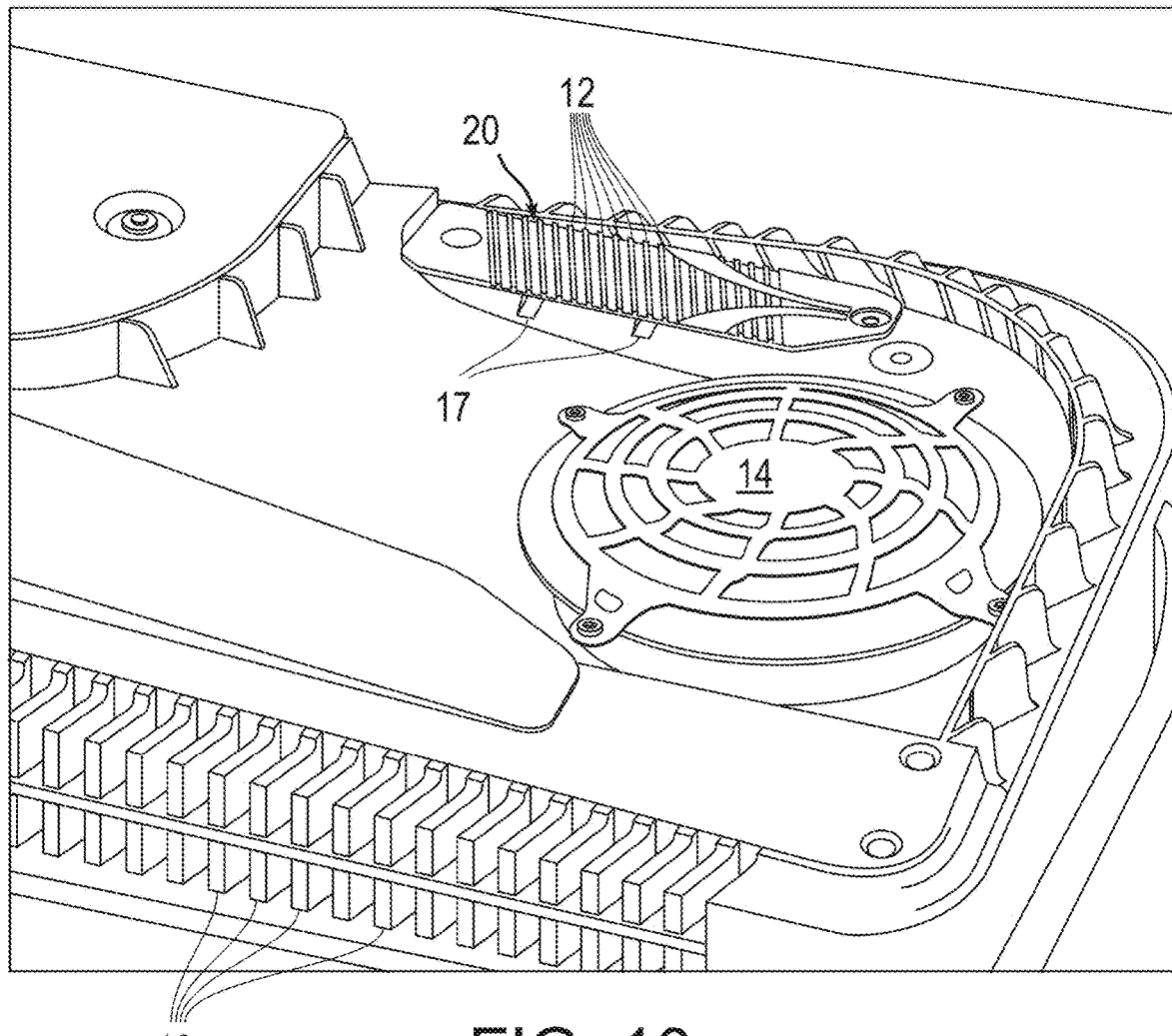
FIG. 10 is a perspective view of the bottom of a Sony PLAYSTATION® 5 console with the cover removed showing the air flow path when the heat sink of the present invention is installed.

A top, rear, right side perspective view, a side view and a bottom perspective view of a heat sink 20 according to the present invention are shown in FIG. 6, FIG. 7 and FIG. 8, respectively. The heat sink has a top plate 22, which as can be seen in FIG. 10, takes the place of the slot cover 10. In particular, it extends over the full extent of the opening of slot 11. As better seen in FIG. 7, the heat sink has a bulk body portion 24 which extends nearly the full length of the interior of the slot. Referring to FIG. 4, it would extend all the way to the left end 18 of the slot 10, while the top plate 20 extends even further to the outer edge 19 of the slot. Note in FIG. 6, the screw hole 23, which allows for a screw to pass through the heat sink into the threaded receptable next to edge 18 to hold it in place. The other end of the heat sink is held in place by a flange 27 that fits into a groove in the end of the slot above where the SSD memory connects to the electrical socket in the slot.

The heat sink has fins 25 that extend in parallel across the heat sink top plate 22 (see FIGS. 6 and 7), as opposed to the prior art in which the heat sink fins extend longitudinally. In addition, these fins are of relatively modest height so as not to block air flow. In particular as shown in FIG. 6, the height of the fins is less than the thickness of the top plate 22, so they do not extend about the top surface of the top plate. The lost in surface area due to the modest size of the fins is more than made up by the size of the bulk body 24. The fins can each be individually angled so as to direct the air flow toward the fan, but operation is sufficient with them all being at the same angle.

Further, the heat sink has a thermal adhesive 26 (FIG. 8) on its bottom which allows it to be easily attached to the top of the SSD memory 30 as shown in FIG. 9. The thermal adhesive is preferably made of thermal conductive materials and cyanoacrylate, but could be made of other adhesives that allow for a firm connection as well as the ready transfer of heat from the SSD memory to the heat sink. FIG. 9 also shows how the chambers or holes 17 provide access to the area under top plate 22 to assist in cooling.

Figure 11:
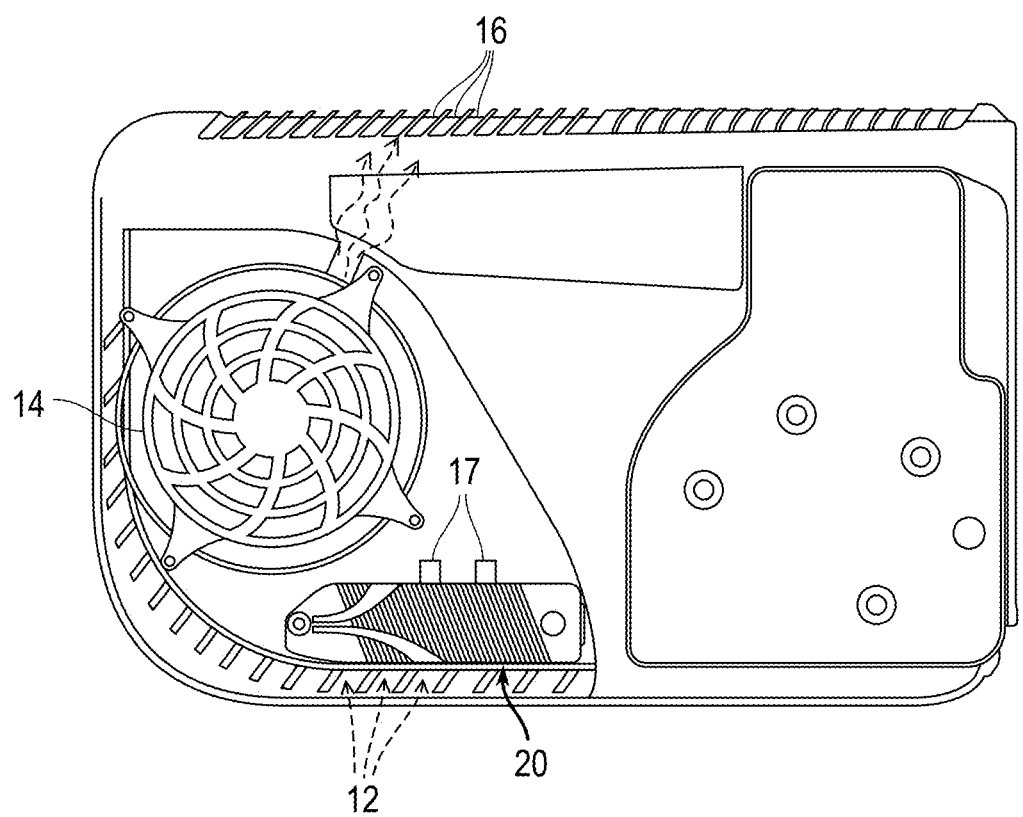
FIG. 11 is a diagram of the air flow of the arrangement in FIG. 10.

The cooling system of the present invention is shown in FIGS. 10 and 11. The intake fan 14 draws air into the console through the vents 12. This causes cooling air to be drawn over the fins 25 of the top plate 22 of the heat sink, providing a great increase in the cooling effect over that of the prior art. In addition the fan draws air from the chambers or holes 17 that extend below the plate 22 providing additional cooling. This air reaches fan 14 and is pushed through the interior cover so as to exit from vents 16 as shown in FIG. 11.

The cooling system of the present invention is shown in FIGS. 10 and 11. The intake fan 14 draws air into the console through the vents 12. This causes cooling air to be drawn over the fins 25 of the top plate 22 of the heat sink, providing a great increase in the cooling effect over that of the prior art. In addition the fan draws air from the chambers or holes 17 that extend below the plate 22 providing additional cooling. The air reaches fan 14 and is pushed through the circuit board so as to exit from vents 16 as shown in FIG. 11.

Because of the arrangement of the heat sink according to the present invention, additional cooling is achieved because (1) its top plate is in the direct air flow and no expansion slot cover is used, (2) the fins of the top plate are relatively short and are angled across the heat sink generally toward the fan so that they provide less blockage to air flow, and (3) the bulk body is longer and thicker than the prior art, thus providing more cooling.

While the invention is explained in relation to certain embodiments, it is to be understood that various modifications thereof will become apparent to those skilled in the art upon reading the specification. In particular, the invention is not limited to use in the PS5® and instead can be used in any electronic console with an available expansion slot. Further, the heat sink can be used in any application that has an SSD memory that needs to be cooled. Therefore, it is to be understood that the invention disclosed herein is intended to cover such modifications as fall within the scope of the appended claims.

The invention claimed is:

1. A heat sink for a solid-state drive (SSD) storage device for use as an extended memory in an expansion slot of an electronic game console, that is recessed below—an interior cover of the console upon which a cooling fan is mounted, said expansion slot having an interior space and an exterior opening at the level of the interior cover, comprising:
   a metal top plate of sufficient width and length to cover the exterior opening of the expansion slot, said top plate having fins on an upper surface that all extend at a diagonal to a longitudinal extent of the top plate, and all have a height that is less than the thickness of the top plate; and
   a rectangular, solid one-piece metal bulk body connected to a bottom surface of the top plate and having a sufficient width and length to fill nearly the full length of the interior of the expansion slot and a thickness so that when the heat sink is mounted on the SSD storage device, the top plate is positioned in contact with and just above the upper edge of the expansion slot.

2. The heat sink of claim 1 wherein the electronic game console is a video game console.

3. The heat sink of claim 1 further including a thermal adhesive fastened to the bottom of the bulk body so as to attach the heat sink to the top of the SSD storage device.

4. A heat sink for a solid-state storage device, comprising:

a metal top plate having a width, a length greater than its width and a thickness, said top plate having fins on an upper surface that all extend at an angle to a longitudinal extent of the top plate; and a rectangular, solid one-piece metal bulk body connected to a bottom surface of the top plate and having a width and length less than the width and length of the top plate and wherein the height of all of the fins is less than the thickness of the top plate and the fins form unobstructed channels across the top plate.

5. A cooling system for a solid-state memory in an expansion slot of an electronic game console that is recessed below an interior cover of the console upon which a cooling fan is mounted, said expansion slot having an interior space and an exterior opening at the level of the interior cover, comprising:

a housing for the game console having air intake vents on one side and air exhaust vents on another side;

a fan within the housing is adapted for drawing air into the housing through the intake vents and pushing it out of the housing through the exhaust vents; and a heat sink mounted on the solid state memory, said heat sink having a metal top plate with a width, a length greater than its width and a thickness less than its width, said top plate having fins on an upper surface that all extend at a diagonal across a longitudinal extent of the top plate, and all have a height that is less than the thickness of the top plate; and said heat sink having a rectangular, solid one piece metal bulk body connected to a bottom surface of the top plate and having a width and length less than the width and length of the top plate and a thickness greater than the thickness of the top plate, the longitudinal extent of said fins is generally directed toward the fan and form unobstructed channels.

6. The cooling system of claim 5 whereby the fan draws air from the intake vents across the lateral extent of the heat sink in the channels between the fins and directs it towards the fan.

* * * * *